United States Patent [19]
Allen

[11] Patent Number: 5,847,581
[45] Date of Patent: Dec. 8, 1998

[54] LOW POWER CMOS PRECISION INPUT RECEIVER WITH INTEGRATED REFERENCE

[75] Inventor: Michael J. Allen, Rescue, Calif.

[73] Assignee: Intel Corporation, Santa Clara, Calif.

[21] Appl. No.: 775,785

[22] Filed: Dec. 31, 1996

[51] Int. Cl.$^6$ .............................................. H03K 19/0175
[52] U.S. Cl. ................................ 326/81; 326/83; 326/87; 326/81
[58] Field of Search .................................. 326/83, 86, 87, 326/68, 80, 81, 121

[56] References Cited

U.S. PATENT DOCUMENTS

| | | | |
|---|---|---|---|
| 5,019,729 | 5/1991 | Kimura et al. | 326/86 |
| 5,030,857 | 7/1991 | Sanwo et al. | 326/86 |
| 5,111,080 | 5/1992 | Mizukami et al. | 326/83 |
| 5,710,516 | 1/1998 | Kim | 326/86 |
| 5,717,345 | 2/1998 | Yokomizo et al. | 326/80 |

*Primary Examiner*—Michael J. Tokar
*Assistant Examiner*—Daniel Chang
*Attorney, Agent, or Firm*—Blakely, Sokoloff, Taylor & Zafman

[57] ABSTRACT

A receiver circuit is provided. The receiver circuit includes a differential stage that has a first input that receives a first signal, a second input that receives a reference signal and an output. The receiver circuit further includes first and second switch devices that receive the first signal and in response to this signal, couple the differential stage to a first and a second, respectively, voltages when the first signal is within a first voltage range. The receiver circuit also includes a keeper circuit that has an input that receives the first signal and an output coupled to the output of the differential stage. The keeper circuit clamps the output to a third voltage when the first signal is within a second voltage range. The keeper circuit also clamps the output to a fourth voltage when the first signal is within a third voltage range.

20 Claims, 2 Drawing Sheets

LOW POWER CMOS PRECISION INPUT RECEIVER WITH INTEGRATED REFERENCE

BACKGROUND OF THE INVENTION (1) Field of the Invention

The present invention relates to the field of electronic circuits. More particularly the present invention relates to a receiver circuit.

(2) Description of Related Art

Input receivers are generally known in the art. For example, complementary metal-oxide semiconductor (CMOS) receivers may be used to interface between other circuit families such as TTL logic and CMOS logic. CMOS digital circuits typically switch between the positive supply voltage and ground (rail-to-rail). These circuits may be used to convert non-rail-to-rail input voltages, such as TTL compatible voltages, into CMOS compatible voltages.

A typical CMOS input receiver circuit may be a CMOS inverter that converts an input voltage into an inverted CMOS compatible voltage. The inverter compares the input voltage to a threshold voltage, which is determined by thresholds and sizes of the two MOS devices of the CMOS inverter. In response, the CMOS inverter generates a high logic voltage at its output when the input voltage is less than the threshold voltage. Similarly, the CMOS inverter generates a low logic voltage at its output when the input voltage is greater than the threshold voltage.

Typically, a CMOS inverter includes a PMOS device connected in series with an NMOS device such that a common drain current flows through both devices. A source of the PMOS device is coupled to the positive supply voltage while a source of the NMOS device is coupled to ground. Applying a common digital input voltage to the gates of the PMOS and NMOS devices produces an inverted output voltage at the PMOS and NMOS devices drain connection which coincides with the output of the CMOS inverter. A standard CMOS inverter stage is explained in David A. Hodges and Horace G. Jackson, *Analysis and Design of Digital Integrated Circuits*, McGraw-Hill, Inc., 1983, pp. 97–101.

Depending on process variations, among other things, the input voltage, at which the output of the CMOS inverter switches, can vary as much as 700 or 800 millivolts. The range of input voltage variation within which the input of a receiver can vary, still producing a desired voltage level at the output, is generally called input threshold range. The CMOS inverter's input threshold range is a function, among other things, of $V_{TN}$ and $V_{TP}$ that are the threshold voltages of the NMOS and PMOS devices, respectively. At room temperature, $V_{TN}$ and $V_{TP}$ have nominal values of approximately 0.7V and 0.9V respectively. These threshold voltages are sensitive to transistor processing variations and changes in the supply voltage. For example, $V_{TN}$ and $V_{TP}$ can vary between approximately 0.5V and 0.9V, and 0.7V and 1.1V respectively. These voltages can further fluctuate by an additional −2.5 millivolts/degree Celsius over a temperature range of −55° to 125°, due to changes in the operating temperature.

In cases where CMOS circuits are interfaced with circuits belonging to other logic technologies, such as TTL logic, one approach for designing a CMOS input receiver circuit is to set the switch point, or threshold point of the CMOS input receiver to a value halfway between $V_{IL}$ and $V_{IH}$, where $V_{IL}$ represents the low input voltage and $V_{IH}$ represents the high input voltage of the logic technology to which the CMOS input receiver is connected. In the case of TTL logic technology, the switchpoint of the CMOS inverter is set to approximately 1.4V. TTL logic levels are defined such that a signal less than 0.8V is a logic 0, while signals greater than 2.0V is a logic 1. It is desirable for the input receiver to switch between 0.8 and 2.0 to correctly sample the input.

The wide input threshold range of the CMOS inverter has an adverse effect on the use of the CMOS inverter as an interface between CMOS circuits and other logic circuits such as TTL circuits. A large variation in the input signal, within the input threshold range, may affect the performance of circuits coupled to the CMOS input receiver in that two or more such circuits may pick up a same signal transmitted at high data rates at different times.

It is desirable to provide an input receiver that has low power dissipation and low input threshold range. It is desirable to provide an input receiver that has low input threshold range to minimize the delay between the sampling of a same signal by two or more circuits coupled to the input receiver.

SUMMARY OF THE INVENTION

The present invention provides a receiver circuit. The receiver circuit includes a differential stage that has first and second inputs configured to receive first and second signals respectively. The receiver has an output. The receiver circuit also includes first and second switch devices configured to receive the first signal and responsive thereto to couple the differential stage to first and second voltages, respectively, when the first signal is within a first voltage range. The receiver circuit further includes a keeper circuit that has an input configured to receive the first signal and an output coupled to the output of the differential stage. The keeper circuit clamps the output to one of third and fourth voltages when the first signal is within one of a second and third voltage ranges, respectively.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention can be practiced without these specific details. In some instances, well-known circuits, structures, and techniques have not been shown in detail to not unnecessarily obscure the present invention.

Figure 1:
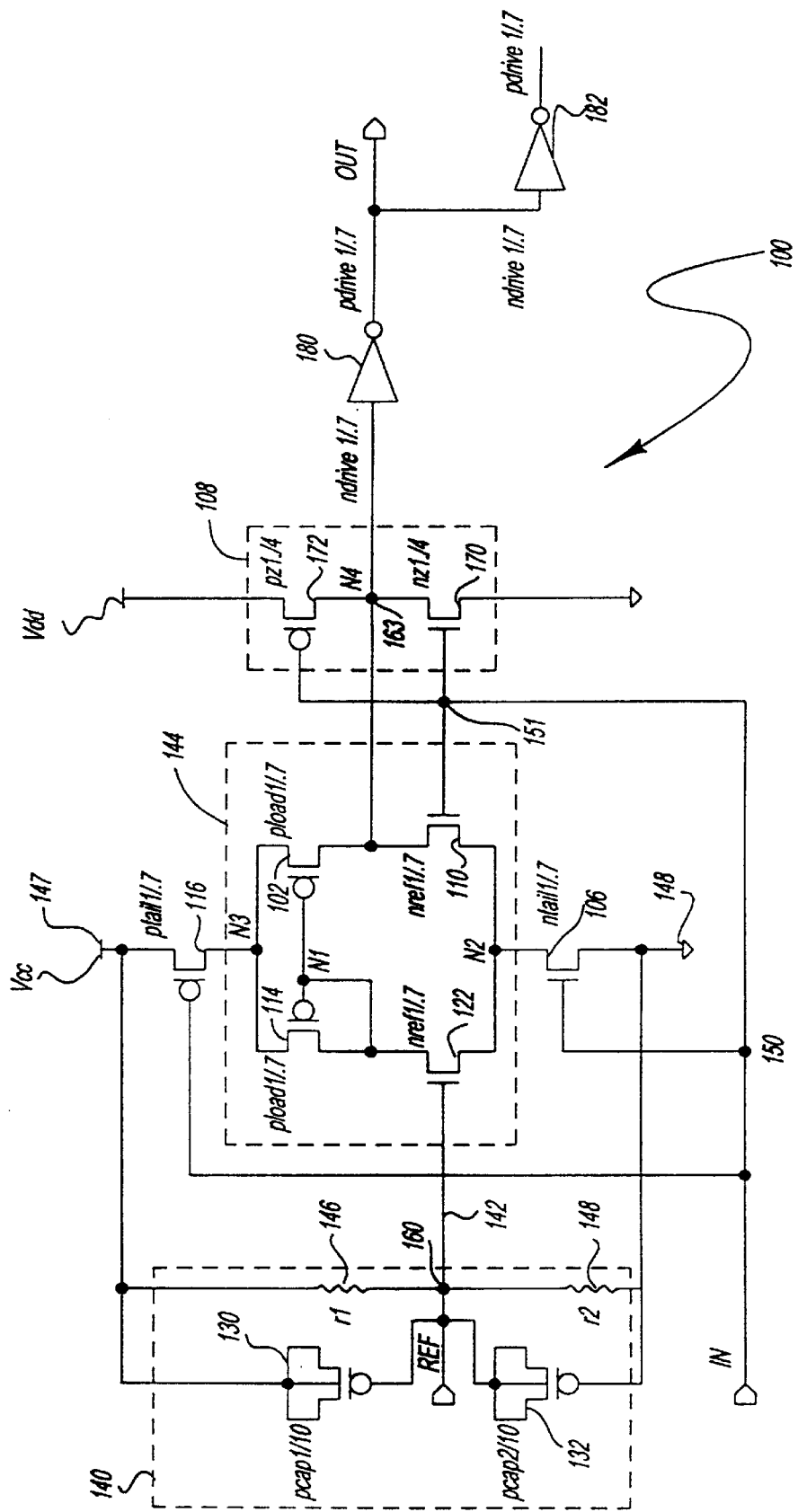
FIG. 1 illustrates one embodiment of a receiver circuit according to the present invention.

FIG. 1 illustrates receiver circuit 100 according to the present invention. Receiver circuit 100 includes a differential stage 144 that has first input 150 and second input 160. First input 150 receives a first signal (hereinafter "input signal") that may be transmitted at a high data rate. Second input 160 receives a second signal (hereinafter "reference signal" or $V_{REF}$). Differential stage 144 has an output node 162 that generates a differential output signal in response to the input and reference signals.

The receiver circuit 100 also may includes a voltage reference source 140 that generates the reference signal to second input 160 of differential stage 144. In one embodiment according to the present invention, the differential stage 144 may be a single-ended differential amplifier but the present invention is not limited in scope in this respect to a single-ended differential amplifier. Differential stage 144 is coupled, via pad 148, to a first supply voltage (hereinafter "first voltage") that may be ground or $V_{SS}$. Differential stage 144 is also coupled, via pad 146, to a second supply voltage (hereinafter "second voltage") that may be $V_{CC}$. In one embodiment according to the present invention, the second voltage is an upper rail voltage for TTL compatible circuits, while the first voltage is substantially equal to 0V (ground). In the embodiment described herein, the second voltage is substantially equal to 3.3V.

Typically, an input signal at a voltage lower than $V_{REF}$ causes the differential stage to drive high, i.e. generate a voltage at a high logic level (i.e., logic 1) at output node 162. An input signal at a voltage greater than $V_{REF}$ causes the differential stage to drive low, i.e. generate at output node 162 a voltage at a low logic level, i.e. 0 logic. In one embodiment according to the present invention, the reference signal typically has a voltage of approximately 1.4V.

The differential stage includes NMOS input devices 122 and 110 but the present invention is not limited in this respect to NMOS devices. NMOS transistor 122 receives at a gate thereof the reference signal $V_{REF}$ driven, via line 142, by the voltage reference source 140. NMOS transistor 110 receives at a gate thereof the input signal. The sources of the NMOS transistors 122 and 110 are coupled to node N2 which is coupled to ground via a first switch device 106 (hereinafter "first power switch device 106").

Differential stage 144 further includes load devices 114 and 102 coupled in a current mirror configuration. In one embodiment according to the present invention, each load device 102 and 114 includes a PMOS transistor, but the present invention is not limited to PMOS transistors. The gate of transistor 114 is coupled to the drain of this transistor and to the gate of PMOS transistor 102. The drains of transistors 114 and 102 are coupled to the drains of transistors 122 and 110 respectively. The sources of PMOS transistor 114 and 102 are coupled to a common node N3. Node N3 is further coupled to pad 146 via a second switch device 116 (hereinafter "second power switch device").

In one embodiment of the present invention, the first power switch device 106 includes NMOS transistor 106 while the second power switch device 116 includes PMOS transistor 116 but the present invention is not limited to a NMOS and a PMOS transistors operating as first and second power switch devices, respectively. In this embodiment, NMOS transistor 106 is selected to have a threshold voltage substantially equal with a threshold voltage of transistor 110. Both transistor 106 and transistor 116 have their gates coupled to input node 150 that receives the input signal. The first and second power switch devices 106 and 116, respectively, couple differential stage 144 to first and second voltages (ground and $V_{CC}$ respectively) when the input signal is within a first voltage range, which is defined as a range of voltage substantially higher than a fifth voltage and substantially lower than a sixth voltage. In one embodiment according to the present invention, the fifth voltage is substantially equal to a threshold voltage $V_{TN}$ of NMOS transistor 106, while the sixth voltage is substantially equal to $V_{CC}-V_{TP}$, where $V_{TP}$ is the threshold voltage of PMOS transistor 116.

Transistor 106 switches off the differential stage 144 from ground when the input signal is at a voltage lower than $V_{TN}$.

Such voltage causes transistor 106 to operate in cut off. Transistor 116 switches the upper rail supply voltage off from differential stage 144 when the input signal is at a voltage substantially higher than $V_{CC}-V_{TP}$ which causes transistor 116 to operate in cut off.

Accordingly, when the input signal is at a voltage lower than the threshold of transistor 106, which is approximately 0.7V, transistor 106 switches off differential stage 144 from ground. Similarly, when the input signal is set to a voltage substantially higher than the second voltage, i.e., $V_{CC}-V_{TP}$, which may typically be 3.3V-0.7V=2.6V, transistor 116 operates in cutoff thereby switching off $V_{CC}$ from differential stage 144. Since the differential stage 144 needs to be coupled to both $V_{CC}$ and ground to operate, the differential stage consumes minimal power once one of $V_{CC}$ or ground is not coupled thereto. Accordingly, when the input signal is set to an undesirable low or high voltage, which is outside the first voltage range, power is shut off from the differential stage 144 thereby avoiding unnecessary consumption of power.

The receiver circuit 100 further includes a keeper circuit 108. The keeper circuit 108 has an input 151 coupled to input node 150, and an output 163 coupled to output node 162 of the differential stage 144. The keeper circuit 108 clamps the output voltage at node 162 to a lower voltage rail of keeper circuit 108 (hereinafter "third voltage") when the input is within a second voltage range. The keeper circuit also clamps the output voltage at node 162 to an upper voltage rail of keeper circuit 108 (hereinafter "fourth voltage") when the input is within a third voltage range. The third voltage includes the lower rail of keeper 108 which is typically ground, but the present invention is not limited in this respect. The fourth voltage includes the upper rail of keeper 108 which may be substantially equal to 5V (CMOS upper rail). The third voltage range includes voltage values that, when applied to node 150, cause keeper 108 to drive low. The second voltage range is the range of voltages that may be coupled to input node 150, that cause keeper 108 to drive high.

Once the output voltage at output node 162 reaches a high or a low voltage level with respect to an upper or lower rail of differential stage 144, keeper 108 pulls the voltage at output node 162 further to the upper or lower rail respectively of keeper circuit 108. The upper rail voltage of keeper circuit 108 may typically be higher than the upper rail of differential stage 144. Additionally, keeper circuit 108 maintains the voltage at output node 162 at the keeper's upper or lower rail despite possible voltage variations at output 162 that may occur had the keeper circuit 108 not been coupled to differential stage 144. In this way, the keeper circuit 108 allows the differential stage 144 to be shut off by power switch devices 116 and 106 without the risk of having the output voltage at node 162 "wander" at undesirable voltage levels which otherwise may occur, in the absence of keeper 108, when power is shut off from the differential stage.

In one embodiment according to the present invention, keeper circuit 108 may be a CMOS inverter, but the present invention is not limited in this respect. CMOS inverter 108 includes NMOS transistor 170 and PMOS transistor 172 coupled at their gates thereof to input node 150. The drains of these transistors are both coupled to output node 162. Transistors 170 and 172 are small size transistors that do not consume a significant amount of power. The width to length (W/L) ratio for transistor 170 and 172 is ¼. Also transistors 170 and 172, due to their small size, do not substantially affect the dynamic switching at output node 162. Consequently, transistors 170 and 172 minorly impact on the output voltage when differential stage 144 is driving. Moreover, when differential stage 144 is not driving, due to voltage values of the input signal that cause one of the power switch devices to shut off the power to the differential stage, CMOS inverter 108 keeps the output set to the desired logic values without consuming prohibitive power. Furthermore, the power consumed when CMOS inverter 108 is driving is substantially lower than the power differential stage 144 would have consumed had the power switch devices been absent from receiver circuit 100.

Assume the reference voltage is set, for example, to 1.4V. If the input signal is set to a voltage between 0.7V and 1.4V, transistor 106 conducts as the voltage difference between the gate and source of this transistor exceeds transistor's 106 threshold voltage which is approximately 0.7V. In this case, transistor 116 conducts as well because the voltage difference between the source and gate of transistor 116 exceeds the threshold voltage for this transistor (assuming that the upper rail supply voltage is greater than $1.4+V_{TP}$). When both the first 106 and second 116 power switch devices are conducting, node N2 is nearly coupled to ground while node N3 is nearly coupled to $V_{CC}$, such that differential stage 144 is powered up. When the input signal is set to a voltage level between 1.4V and 2.6V, both transistors 116 and 106 conduct assuming that $V_{CC}$ is higher than $2.6V+V_{TP}$ of transistor 116. Accordingly, the differential stage is operative when the input signal is within the first voltage range which is approximately 0.7 to 2.6 volts. In this case, for input voltages between 0.7 and 1.4 volts (second voltage range), keeper circuit 108 is overpowered by differential stage 144 which forces the output to drive high. Similarly, when the input voltage is between 1.4V and 2.6V (the third voltage range) the differential stage 144 forces the output to drive low.

Note that when the input signal is at a voltage lower than 0.7 volts or higher than 2.6 volts, respectively, the differential stage 144 is powered down, a variation in the input below 0.7V or above 2.6v does not affect the switching point of output node 162 of receiver 100 since CMOS inverter 108 generates at the output either a logic 1 or a logic 0 respectively. Therefore, for voltages lower than 0.7 volts or higher than 2.6 volts, the CMOS inverter 108 does not introduce a higher input threshold of its own. However, when the input signal is set to a voltage between 0.7 and 2.6 volts such that differential stage 144 is powered up, the input threshold range of receiver 100 is determined by the input threshold range of differential stage 144 (approximately ±50 mv), which is generally much tighter than the input threshold range of CMOS inverter 108. Accordingly, the receiver 100 has a relatively low input threshold range and reduced power dissipation conferred by power switch devices 106 and 116, while the CMOS inverter 108 does not consume a significant amount of power.

The input receiver 100 according to the present invention further includes a voltage reference device 140. In one embodiment according to the present invention, the voltage reference device is an integrated voltage reference device, but the present invention is not limited to an integrated voltage device. The integrated voltage reference device 140 includes a capacitor voltage divider made up of capacitors 130 and 132. Moreover, the integrated voltage reference device 140 includes a resistor voltage divider made up of resistors 146 and 148. Unlike conventional voltage dividers which utilize solely resistor dividers for providing a reference voltage off of, the present voltage reference device 140 utilizes a capacitor voltage divider in addition to the resistor voltage divider. The combination of a resistor voltage divider and a capacitor voltage divider provides faster response to voltage variations in the supply voltage without utilizing lower value resistors. Lower value resistors typically dissipate a larger amount of power due to a higher current flowing through these resistors (approximately in the range of milliamps). In one embodiment according to the present invention, resistors 146 and 148 are in the order of 3 Megaohms while the sustaining current flowing through resistors 146 and 148 is on the order of microamps instead of milliamps. Capacitors 130 and 132 do not dissipate a large amount of power and respond quickly to changes in the supply voltage such that lower value resistors, which otherwise dissipate more power, are not needed to provide faster response to changes in the supply voltage. Accordingly, resistors 146 and 148 pull node 160 to a desired reference voltage without causing a prohibitive consumption of power while capacitors 130 and 132 provide fast dynamic switching. The range of values for the resistors in the integrated voltage reference device is 1–3 Megaohms. The range of values for the capacitors in the integrated voltage reference device is 0.1 pF. In one embodiment according to the present invention, the voltage reference node is set to 0.4 of.

Integrated voltage reference device 140 may quickly adjust the reference voltage at node 160, whether the change in supply voltage is caused by random spikes at or by a shift in the voltage of the supply voltage. For example, in mobile systems utilizing solely a resistor divider, the resistors chosen may have higher values such that the receiver does not dissipate a high amount of power. In this case the receiver may run slower due to the higher value of the resistors which do not afford a fast change in the voltage at node 160 when the voltage is dropped to another level. The input receiver of the present invention with the integrated voltage reference 140 may be used in mobile systems to provide a faster change in the voltage at node 160 when changes in the voltage supply occur.

Capacitors 130 and 132 may be metal stack capacitors, poly capacitors or junction capacitors. In the embodiment according to the present invention described herein, the capacitance ratio of capacitors 130 and 132 is substantially equal to the resistance ratio of the resistors 146 and 148. Also in this embodiment, capacitors 130 and 132 are implemented by using PMOS devices having the source and drain coupled together, such that the gate capacitance is the capacitance of each of the devices 130 and 132. In the embodiment described herein, the voltage reference device 140 provides a response to changes in supply voltages within a range of nanoseconds while the standby current going through the resistor divider is within the range of microamps.

Figure 2:
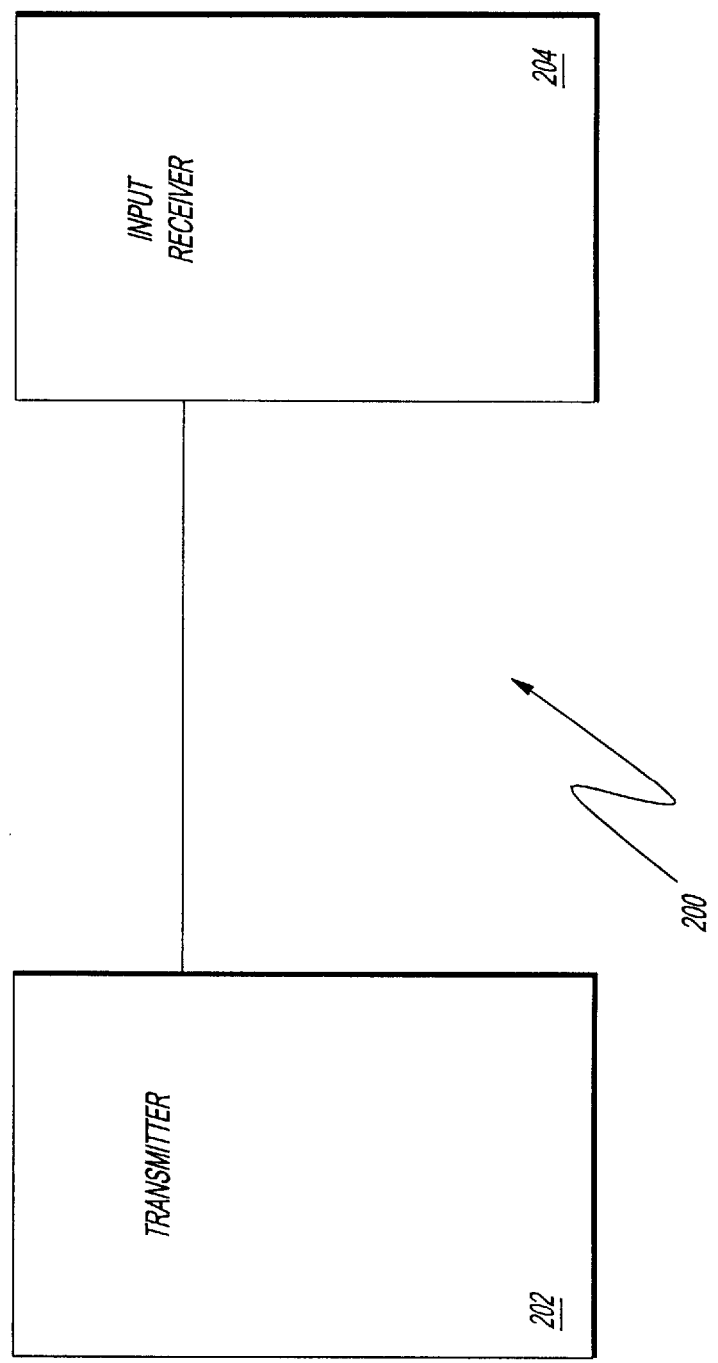
FIG. 2 illustrates a system utilizing the input receiver circuit according to the present invention.

FIG. 2 illustrates a system 200 utilizing the input receiver circuit according to the present invention. System 200 includes a transmitter device 202 that may transmit data at a fast rates such as rates on the order of hundreds of Megahertz, although the present invention is not limited in this respect. Transmitter device 202 is coupled to an input receiver circuit 204 that is substantially similar with the input receiver discussed above.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

I claim:

1. A receiver circuit comprising:
   a differential stage having first and second inputs, configured to receive first and second signals respectively, and an output;
   first and second switch devices configured to receive said first signal and responsive thereto to couple said differential stage to a first and second voltages, respectively, when said first signal is within a first voltage range; and
   a keeper circuit having an input configured to receive said first signal, and an output coupled to said output of said differential stage, said keeper circuit clamping said output to one of third and fourth voltages when said first signal is within one of a second and third voltage ranges respectively.

2. The receiver circuit of claim 1 wherein said first switch device switches off the first voltage from the differential stage when said first signal is lower than a fifth voltage.

3. The receiver circuit of claim 2 wherein said second switch device switches off the second voltage from the differential stage when said first signal is higher than a sixth voltage.

4. The receiver circuit of claim 1 further comprising an integrated voltage reference device with a reference node for generating said second signal at said reference node.

5. The receiver circuit of claim 4 wherein said integrated voltage reference divider includes a capacitor voltage divider and a resistor voltage divider coupled in parallel with said capacitor voltage divider.

6. The receiver circuit of claim 5 wherein said capacitor voltage divider includes first and second capacitors coupled to said reference node.

7. The receiver circuit of claim 6 wherein said resistor voltage divider includes first and second resistors coupled to said reference node.

8. The receiver circuit of claim 7 wherein a ratio of said first and second capacitances is substantially equal to a ratio of said first and second resistors.

9. The receiver circuit of claim 1 wherein said differential stage is a single-ended differential amplifier.

10. The receiver circuit of claim 9 wherein said keeper circuit is a CMOS inverter.

11. A system comprising:
    a differential stage having first and second inputs, configured to receive first and second signals respectively, and an output;
    first and second switch devices configured to receive said first signal and responsive thereto to couple said differential stage to a first and second voltages, respectively, when said first signal is within a first voltage range; and
    a keeper circuit having an input configured to receive said first signal, and an output coupled to said output of said differential stage, said keeper circuit clamping said output to one of third and fourth voltages when said first signal is within one of a second and third voltage ranges respectively.

12. The system of claim 11 wherein said first switch device switches off the first voltage from the differential stage when said first signal is lower than a fifth voltage.

13. The system of claim 12 wherein said second switch device switches off the second voltage from the differential stage when said first signal is higher than a sixth voltage.

14. The system of claim 11 further comprising an integrated voltage reference device with a reference node for generating said second signal at said reference node.

15. The system of claim 14 wherein said integrated voltage reference divider includes a capacitor voltage divider and a resistor voltage divider coupled in parallel with said capacitor voltage divider.

16. The system of claim 15 wherein said capacitor voltage divider includes first and second capacitors coupled to said reference node.

17. The system of claim 16 wherein said resistor voltage divider includes first and second resistors coupled to said reference node.

18. The system of claim 17 wherein a ratio of said first and second capacitances is substantially equal to a ratio of said first and second resistors.

19. The system of claim 11 wherein said differential stage is a single-ended differential amplifier.

20. The system of claim 19 wherein said keeper circuit is a CMOS inverter.

* * * * *